United States Patent
Rahimi et al.

(10) Patent No.: US 12,474,489 B2
(45) Date of Patent: *Nov. 18, 2025

(54) SENSOR SYSTEM AND METHOD FOR GAMMA RADIATION DOSE MEASUREMENT

(71) Applicant: Purdue Research Foundation, West Lafayette, IN (US)

(72) Inventors: Rahim Rahimi, West Lafayette, IN (US); Ulisses Heredia Rivera, Hillsboro, OR (US)

(73) Assignee: Purdue Research Foundation, West Lafayette, IN (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/612,922

(22) Filed: Mar. 21, 2024

(65) Prior Publication Data
US 2024/0264316 A1   Aug. 8, 2024

Related U.S. Application Data

(63) Continuation of application No. 17/569,031, filed on Jan. 5, 2022, now Pat. No. 11,960,037.
(Continued)

(51) Int. Cl.
*G01T 1/02* (2006.01)
*H10K 39/32* (2023.01)
*H10K 77/10* (2023.01)

(52) U.S. Cl.
CPC ............. *G01T 1/026* (2013.01); *H10K 39/32* (2023.02); *H10K 77/111* (2023.02)

(58) Field of Classification Search
None
See application file for complete search history.

(56) References Cited

U.S. PATENT DOCUMENTS

| | | |
|---|---|---|
| 3,426,197 A | 2/1969 | Waly et al. |
| 4,859,853 A | 8/1989 | Kronenberg |
| (Continued) | | |

OTHER PUBLICATIONS

Alhosseini, S. N.; Moztarzadeh, F.; Mozafari, M.; Asgari, S.; Dodel, M.; Samadikuchaksaraei, A.; Kargozar, S.; Jalali, N., "Synthesis and characterization of electrospun polyvinyl alcohol nanofibrous scaffolds modified by blending with chitosan for neural tissue engineering," International Journal of Nanomedicine, 2012, 7, p. 24-34.
(Continued)

*Primary Examiner* — Hoon K Song
(74) *Attorney, Agent, or Firm* — Purdue Research Foundation

(57) ABSTRACT

A printed radiation sensor that includes a substrate, an interdigitated electrode, and a conductive polymeric film. The interdigitated electrode including a first electrode with a plurality of first electrode digits and a second electrode with a plurality of second electrode digits. The interdigitated electrode disposed on the substrate. The conductive polymeric film including a blend of poly(3,4-ethylenedioxythiophene) polystyrene sulfonate (PEDOT:PSS) and polyvinyl alcohol (PVA). The PEDOT:PSS is configured to provide an electrically conductive medium. The PVA is configured to provide ductility and stability of the printed radiation sensor. Upon radiation exposure, the PVA is further configured to crosslink within a material matrix of the printed radiation sensor militating against the recombination of chain scission by forming a semi-interpenetrating polymer network (SIPN) with the PEDOT:PSS to provide an enhanced and stable impedance reading.

16 Claims, 12 Drawing Sheets

Related U.S. Application Data

(60) Provisional application No. 63/134,276, filed on Jan. 6, 2021.

(56) References Cited

U.S. PATENT DOCUMENTS

| | | | |
|---|---|---|---|
| 4,918,317 | A | 4/1990 | Hess et al. |
| 5,451,792 | A | 9/1995 | Maguire et al. |
| 5,656,815 | A | 8/1997 | Justus et al. |
| 7,476,874 | B2 | 1/2009 | Patel |
| 9,099,310 | B1 | 8/2015 | Lee et al. |
| 11,960,037 | B2* | 4/2024 | Rahimi ............... H10K 39/32 |
| 2020/0083298 | A1* | 3/2020 | Hasegawa ........... H10K 39/32 |
| 2020/0203433 | A1* | 6/2020 | Fichet ................. H10K 30/65 |
| 2021/0115220 | A1* | 4/2021 | Rajagopalan ........ C09D 129/04 |

OTHER PUBLICATIONS

Bhattacharya, A., "Radiation and industrial polymers," Prog. Polym. Sci, 25, 2000, pp. 371-401.

Bracco, P., Brach del Prever, E.M., Cannas, M., Luda, M.P., Costa, L., "Oxidation behaviour in prosthetic UHMWPE components sterilised with high energy radiation in a low-oxygen environment," Polymer Degradation and Stability 91, 2006, pp. 2030-2038.

Costa, L., Luda, M.P., Trossarelli, L., Brach del Prever, E.M., Crova, M., Gallinaro, P., "Oxidation in orthopaedic UHMWPE sterilized by gamma-radiation and ethylene oxide," Biomaterials 19, 1998, pp. 659-668.

Crispin, X.; Jakobsson, F.; Crispin, A.; Grim, P.; Andersson, P.; Volodin, A.; Van Haesendonck, C.; Van der Auweraer, M.; Salaneck, W. R.; Berggren, M., "The origin of the high conductivity of poly (3, 4-ethylenedioxythiophene)-poly (styrenesulfonate)(PEDOT-PSS) plastic electrodes," Chemistry of Materials, 2006, 18, pp. 4354-4360.

De, R.; Lee, H.; Das, B., "Exploring the interactions in binary mixtures of polyelectrolytes: Influence of mixture composition, concentration, and temperature on counterion condensation," Journal of Molecular Liquids, 2018, 251, pp. 94-99 (published online Dec. 2017).

El Salmawi, K.M., "Gamma Radiation-Induced Crosslinked PVA/Chitosan Blends for Wound Dressing," J. Macromolecular Science, Part A, 44:5, 2007, pp. 541-545.

Gholampour, N.; Brian, D.; Eslamian, M., "Tailoring characteristics of PEDOT: PSS coated on glass and plastics by ultrasonic substrate vibration post treatment," Coatings, 2018, 8, 337, pp. 1-17.

Gorna, K., Gogolewski, S., "The effect of gamma radiation on molecular stability and mechanical properties of biodegradable polyurethanes for medical applications," Polymer Degradation and Stability, 79, 2003, pp. 465-474.

International Atomic Energy Agency (IAEA), Guidelines for Industrial Radiation Sterilization of Disposable Medical Products (Cobalt-60 Gamma Irradiation), IAEA-TECDOC-539, Austria, 1990.

Hsiao, Y.-S.; Whang, W.-T.; Chen, C.-P.; Chen, Y.-C., "High-conductivity poly (3,4-ethylenedioxythiophene): poly (styrene sulfonate) film for use in ITO-free polymer solar cells," Journal of Materials Chemistry, 2008, 18, pp. 5948-5955.

Ilčin, M., Holá, O., Bakajová, B., Kučerík, J., "FT-IR study of gamma-radiation induced degradation of polyvinyl alcohol (PVA) and PVA/humic acids blends," J. Radioanal. Nucl. Chem, 2010, 283, pp. 9-13 (published online Aug. 2009).

Jaffray, D.A., Gospodarowicz M.K., Radiation Therapy for Cancer. In: Gelband H, Jha P., Sankaranarayanan R., et al., editors. Cancer: Disease Control Priorities, Third Edition (vol. 3), Washington (DC): The International Bank for Reconstruction and Development / The World Bank; Nov. 1, 2015, Chapter 14, pp. 1-12.

Kane, M.C., Lascola, R.J., Clark, E.A., "Investigation on the effects of beta and gamma irradiation on conducting polymers for sensor applications," Radiation Physics and Chemistry, 79, 2010, pp. 1189-1195.

Khan, S., Lorenzelli, L., Dahiya, R.S., "Technologies for Printing Sensors and Electronics Over Large Flexible Substrates: A Review," IEEE Sensors Journal, 15:6, 2015, pp. 3164-3185.

Krupa, I., Luyt, A.S., "Thermal properties of isotactic polypropylene degraded with gamma irradiation," Polymer Degradation and Stability, 72, 2001, pp. 505-508.

Laranjeira, J.M.G., Khoury, H.J., de Azevedo, W.M., de Vasconcelos, E.A., da Silva, E.F., "Polyaniline nanofilms as a monitoring label and dosimetric device for gamma radiation," Materials Characterization, 50, 2003, pp. 127-130.

Little, JB, "Principal Cellular and Tissue Effects of Radiation," In: Kufe DW, Pollock RE, Weichselbaum RR, et al., editors. Holland-Frei Cancer Medicine, 6th edition, Hamilton (ON): BC Decker; 2003.

Lobez, J.M., Swager, T.M., "Radiation Detection: Resistivity Responses in Functional Poly(Olefin Sulfone)/Carbon Nanotube Composites," Angewandte Chemie International Edition, 49, 2010, pp. 95-98.

Malekie, S., Ziaie, F., Esmaeli, A., "Study on dosimetry characteristics of polymer-CNT nanocomposites: Effect of polymer matrix," Nuclear Instruments and Methods in Physics Research A, 816, 2016, pp. 101-105.

Mallakpour, S.; Dinari, M., "Enhancement in thermal properties of poly(vinyl alcohol) nanocomposites reinforced with Al2O3 nanoparticles," Journal of Reinforced Plastics & Composites, 2013, 32 (4), pp. 217-224.

Mclaughlin, W L, Humphreys, J C, and Miller, A., "Dosimetry for Industrial Radiation Processing," Seminar on Traceability for Ionizing Radiation Measurements, National Bureau of Standards, Gaithersburg, MD, May 8-9, 1980.

Nowack B., David, R.M., Fissan, H., Morris, H., Shatkin, J.A., Stintz, M., Zepp, R., Brouwer, D., "Potential release scenarios for carbon nanotubes used in composites," Environment International, 59, 2013, pp. 1-11.

Ionizing Radiation, NRC.gov, glossary for Ionizing radiation, Mar. 9, 2021, 1 pg., available online at least as early as Jul. 23, 2019 at URL https://www.nrc.gov/reading-rm/basic-ref/glossary/ionizing-radiation.html.

Measuring Radiation, NRC.gov, glossary for Measuring Radiation, Mar. 2020, pp. 1-2, available online at least as early as Jun. 26, 2019 at URL https://www.nrc.gov/about-nrc/radiation/health-effects/measuring-radiation.html.

Nuclear Power Today, Nuclear Energy, World Nuclear Association, "Nuclear Power in the World Today," 2016, pp. 1-9, available online at least as early as Jul. 23, 2019 at URL https://www.world-nuclear.org/information-library/current-and-future-generation/nuclear-power-in-the-world-today.aspx.

Premnath, V., Harris, W.H., Jasty, M., Merrill, E.W., "Gamma sterilization of UHMWPE articular implants: an analysis of the oxidation problem," Biomaterials 17, 1996, pp. 1741-1753.

National Cancer Institute, "Radiation Therapy Side Effects," [WWW Document], 2018, pp. 1-4, available online at least as early as Jul. 23, 2019, available online at URL https://www.cancer.gov/about-cancer/treatment/types/radiation-therapy/side-effects.

Schrote, K., Frey, M.W., "Effect of irradiation on poly(3,4-ethylenedioxythiophene):poly(styrenesulfonate) nanofiber conductivity," Polymer, 54, 2013, pp. 737-742.

Scrosati, B., "Applications of Electroactive Polymers," 1993, Springer Netherlands, Dordrecht, pp. 294-340.

Sonkwade, R.G., Kumar, V., Kumar, L., Annapoorni, S., Vaijapurkar, S.G., Dhaliwal, A.S., "Effects of gamma ray and neutron radiation on polyanilne conducting polymer," Indian Journal of Pure & Applied Physics, 48, 2010, pp. 453-456.

1910.1096—Ionizing radiation. | Occupational Safety and Health Administration, amended Jun. 20, 1996, [WWW Document], n.d., available online at URL https://www.osha.gov/laws-regs/regulations/standardnumber/1910/1910.1096.

* cited by examiner

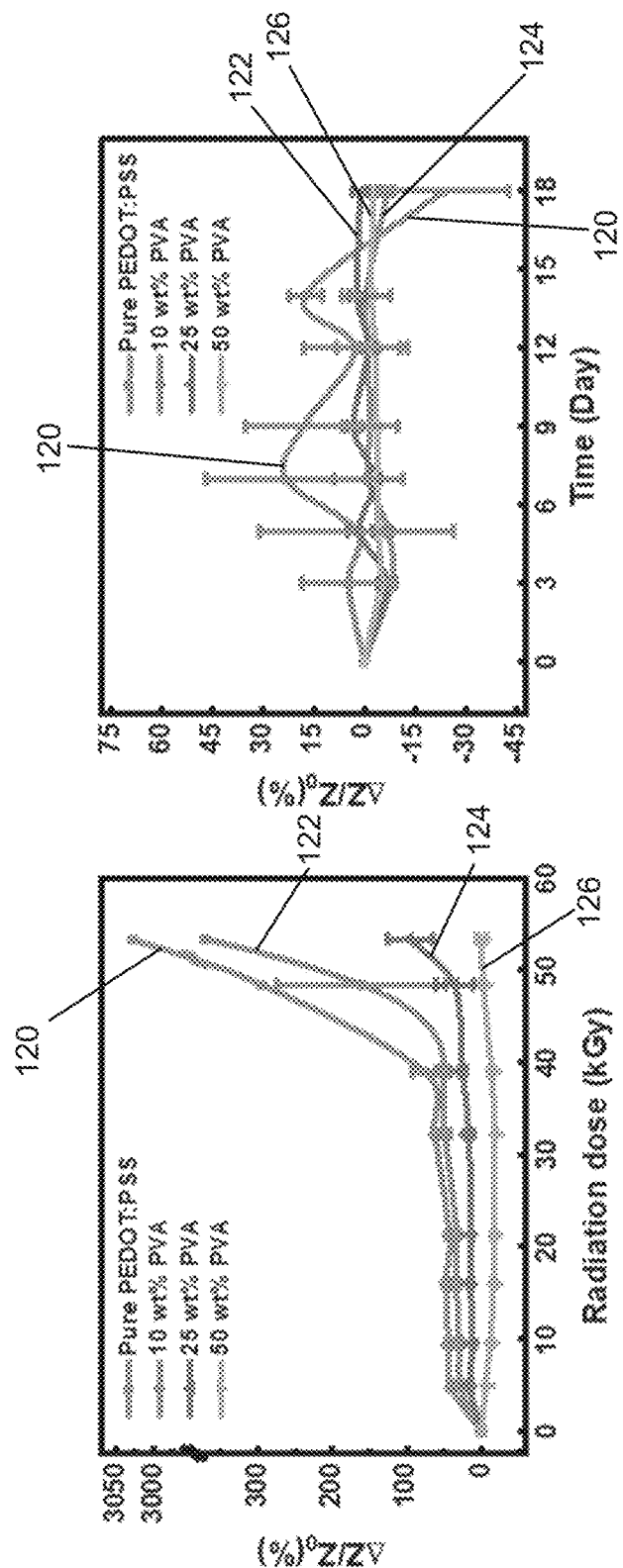

SENSOR SYSTEM AND METHOD FOR GAMMA RADIATION DOSE MEASUREMENT

CROSS REFERENCE TO RELATED APPLICATIONS

This application is a continuation application of U.S. application Ser. No. 17/569,031, filed Jan. 5, 2022, which claims the benefit of U.S. Provisional Application Ser. No. 63/134,276, filed on Jan. 6, 2021. The entire disclosures of the above applications are hereby incorporated herein by reference.

FIELD

The present disclosure relates to sensors and, more particularly, to gamma radiation sensors.

INTRODUCTION

This section provides background information related to the present disclosure which is not necessarily prior art.

According to the latest disinfection and sterilization guidelines published by U.S. Centers for Disease Control and Prevention (CDC) for medical facilities, around ~47 million surgical and invasive medical procedures are performed annually. These procedures include unavoidable contact by a surgical instrument or medical device with the patient's mucous membrane, vascular system, and/or sterile tissue. The use of infected or unsterilized medical equipment for another patient transports not only a threat related with breach of host barriers but also the risk for human-to-human spread of various illnesses, such as Coronavirus Disease-2019 (Covid-19) and hepatitis uB virus, provided as non-limiting examples. Therefore, to militate against the surgical or medical instruments from transmitting infectious pathogens to patients, as well as to stop the spread of ongoing Covid-19, proper sterilization and cleaning of all pharmaceutical equipment (e.g., reusable, and single-use bioreactors) and food is extremely important and essential. Sterilization should be understood as a process used to effectively kill or inactivate harmful microorganisms (e.g., microbes and viruses) present on a specific surface.

The conventional sterilization methods fall into one of the following categories: thermal sterilization, radiation sterilization, chemical sterilization, and filtration. Many single use medical devices, such as syringes, surgical gloves, masks, and personal protective equipment (PPE), are chemical and temperature sensitive, which makes the radiation sterilization method a preferred method over thermal and chemical sterilization processes. Moreover, as seen during the Covid-19 pandemic, when there is a large demand for proper sterilization of single use items (such as masks and PPE kits) at a rapid scale, a fast radiation sterilization method is preferred over the slower thermal and chemical sterilization processes. Additionally, radiation sterilization offers competitive advantages over other sterilization methods such as enhanced penetration, heightened certainty of sterility, and enhanced effectiveness independent of temperature and pressure conditions. Radiation sterilization can also be used for sterilization of a final packed product ensuring that the irradiated product remains sterile until the product is removed from the package.

Despite the several benefits of radiation sterilization, it also has the downside of requiring proper monitoring of the dosage that is applied to the package or medical device. In particular, when gamma radiation is used to sterilize polymer-based products, significant attention should be given to avoid over-exposure and under-exposure of the product. High radiation exposure may lead to deleterious effects on the chemical and mechanical characteristics of materials and may create toxic compounds. Polymer degradation via crosslinking and chain scission may occur simultaneously in polymers at high radiation doses. Conversely, under-exposure may result in the ineffective eradication of pathogens such as bacteria and viruses on the medical device. Therefore, to avoid the over-exposure and under-exposure of medical devices to gamma radiation, effective monitoring of radiation sterilization processes is important.

Many radiation sterilization facilities often require stacking packaged medical instruments in large tote containers. Due to the high variability in terms of packaged medical instruments and the material used in their fabrication, there can be large variability between levels of exposure that each packaged instrument may receive in this process. Therefore, it is a critical need to have distributed sensors attached to each packaged instrument inside the container that can measure the received dosage of each package after the radiation sterilization process. Currently, two types of known dosimeters (active and passive) have been used for the radiation detection. Active technology commonly utilizes some form of solid-state electronic device that measures the amount of ionizing radiation present in their environment, which can be interfaced with a readout device. These active devices are often too costly for use in such sterilization processes and thus, their use is limited to wearable dosimeter applications for occupational monitoring applications by personnel in nuclear and hospital facilities. Passive based technologies are often based on colorimetric methods where a sensing compound changes color with exposure to radiation. In spite of their simplicity, they often require costly UV spectroscopy machinery for measurement, as well as suffering from high variability and low sensitivity. Hence, there remains a need to develop an adequately sensitive, low cost, and easy to use platform for monitoring the radiation sterilization process.

Recently, conducting polymers have been extensively used for the development of printed low-cost sensors including humidity, temperature, pH, strain, and gas sensors. Even more recently, due to unique changes exhibited by conducting polymers in their electrical properties upon exposure to ionizing radiation, these polymers have also been used for radiation sensing. For instance, Pacheco et al., 2003, *Polyaniline/poly acid acrylic thin film composites: A new gamma radiation detector*, Mater. Charact. 50, 245-248, developed thin films based on polyaniline/poly acid acrylic (PANI/PAA) composites for gamma radiation detection. Bodugöz et al., 2005, *Radiation induced dehydrochlorination as an in-situ doping technique for enhancement of the conductivity of polyaniline blends*, Nucl. Instruments Methods Phys. Res. Sect. B Beam Interact. Mater. Atoms. 236, 153-159, studied the in-situ radiation-induced acid doping process of polyaniline/poly(vinyl) chloride (PANI/PVC) composites. Further, Kane et al., 2010, *Investigation on the effects of beta and gamma irradiation on conducting polymers for sensor applications*, Radiation Physics and Chemistry 79, 1189-1195, reported the effects of ionizing radiation on the PEDOT-based materials to gamma and beta radiation doses between 10 Gray and 107 Gray. However, the changes in conductivity using PEDOT:PSS alone is erratic and ill-suited for sensor applications. Despite the substantial progress in the radiation sensors using conducting polymers, there is a continuing need to develop a low-cost, flexible, portable, and printed dosimeter at a large scale.

SUMMARY

In concordance with the instant disclosure, a radiation sensing system and method that enhances the certainty of adequate sterility and that may be manufactured more efficiently over known radiation sensors, has been surprisingly discovered.

In one embodiment, a radiation sensor includes a substrate, an electrode, and a conductive polymeric film. The substrate may be flexible. The electrode may be an interdigitated electrode including a first electrode with a plurality of first electrode digits and a second electrode with a plurality of second electrode digits. The interdigitated electrode may be disposed on the substrate. The conductive polymeric film may include a blend of poly(3,4-ethylenedioxythiophene) polystyrene sulfonate (PEDOT:PSS) and polyvinyl alcohol (PVA). The conductive polymeric film may be disposed on and/or between the first electrode and the second electrode. The radiation sensor may include an all-printed sensor that utilizes a mixer of PVA and PEDOT:PSS as the active radiation sensing material. The PEDOT:PSS may act as the electrically conductive medium, while the PVA may advantageously provide ductility and stability of the printed sensor. Upon radiation exposure, the PVA may crosslink within a material matrix of the printed radiation sensor militating against the recombination of chain scission by forming a semi-interpenetrating polymer network (SIPN) with PEDOT:PSS which may result in a more stable impedance reading. Desirably, the radiation sensor may utilize scalable printing technologies which may further permit low-cost manufacturing of the radiation sensor at large scale.

In another embodiment, the present technology includes methods of using the radiation sensor. For instance, a method of using the radiation sensor may include providing a sample to be treated by a gamma radiation. The method may also include providing a sensor having a substrate, an electrode, and a conductive polymeric film. The substrate may be flexible. The electrode may be an interdigitated electrode including a first electrode with a plurality of first electrode digits and a second electrode with a plurality of second electrode digits. The interdigitated electrode may be disposed on the substrate. The conductive polymeric film may include a blend of poly(3,4-ethylenedioxythiophene) polystyrene sulfonate (PEDOT:PSS) and polyvinyl alcohol (PVA). The conductive polymeric film may be disposed on and/or between the first electrode and the second electrode. Next, the method may include disposing the sensor within a predetermined proximity to the sample. Afterwards, gamma radiation may be applied to the sample. The method may further include monitoring a dose range of the gamma radiation applied to the sample with the sensor.

Further areas of applicability will become apparent from the description provided herein. It should be understood that the description and specific examples are intended for purposes of illustration only and are not intended to limit the scope of the present disclosure.

DRAWINGS

The drawings described herein are for illustrative purposes only of selected embodiments and not all possible implementations and are not intended to limit the scope of the present disclosure.

Figure 3B:
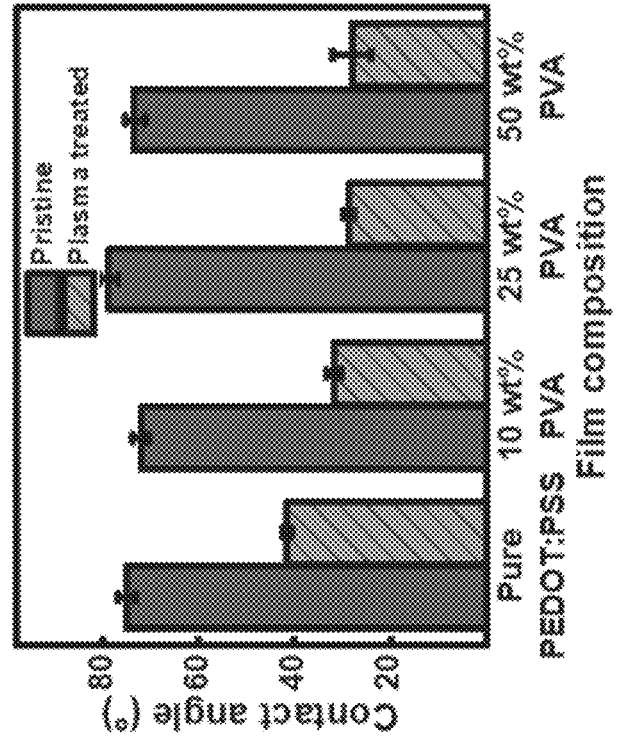
Figure 3A:
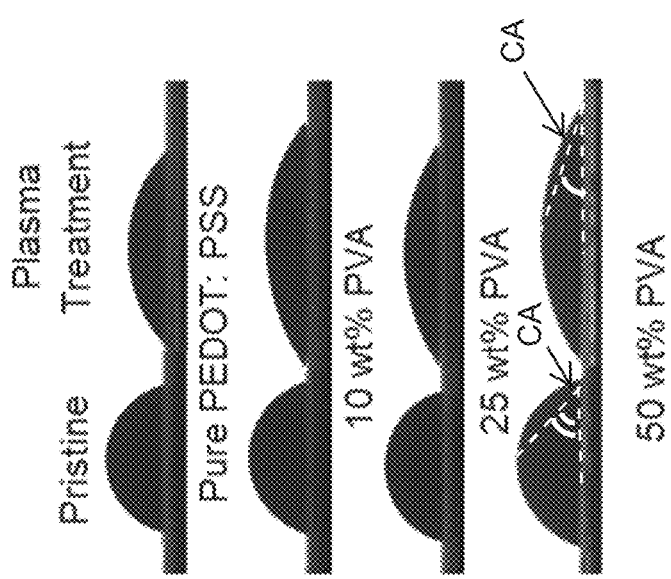
Figure 4:
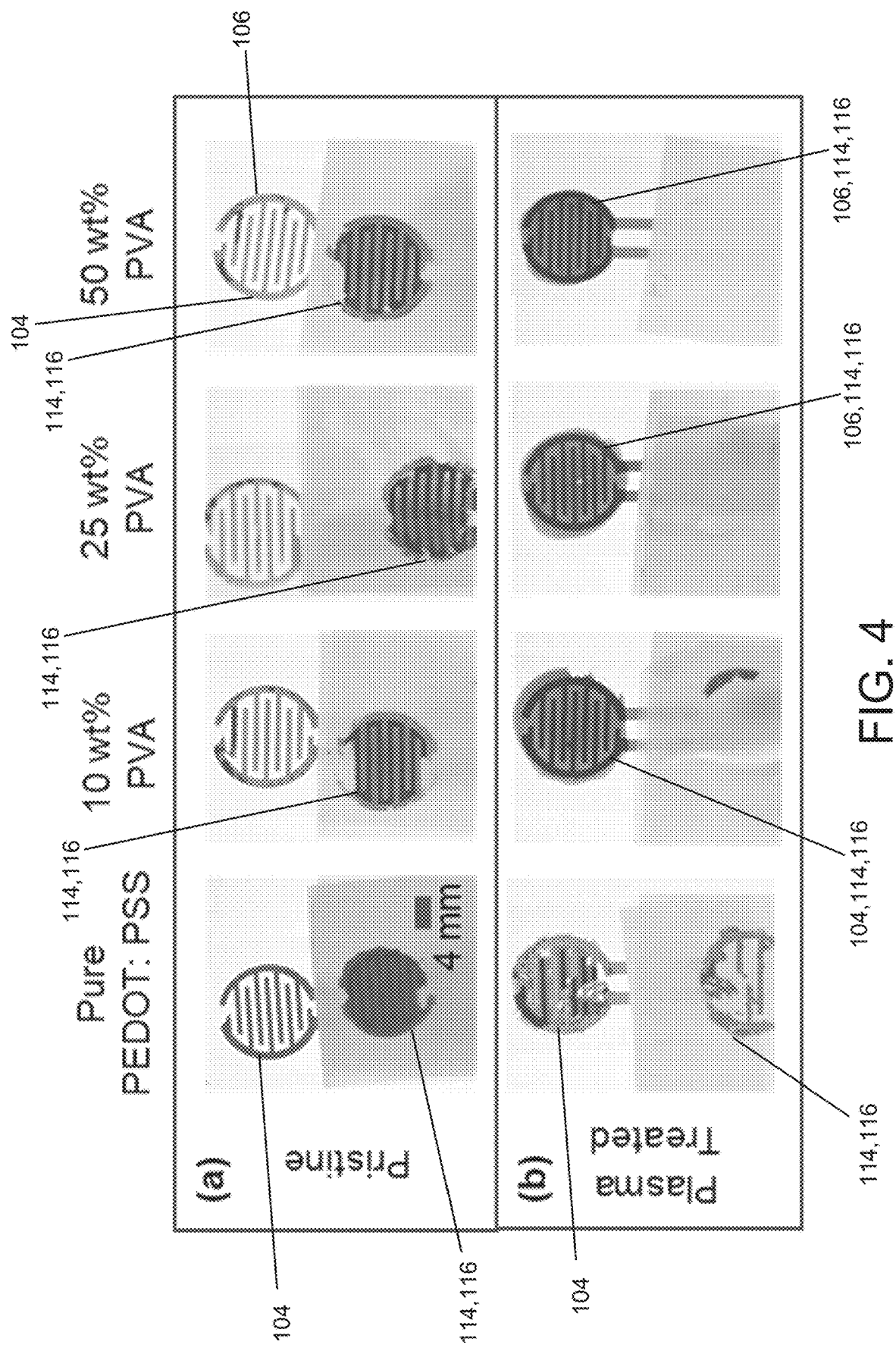
Figures 5A, 5B:
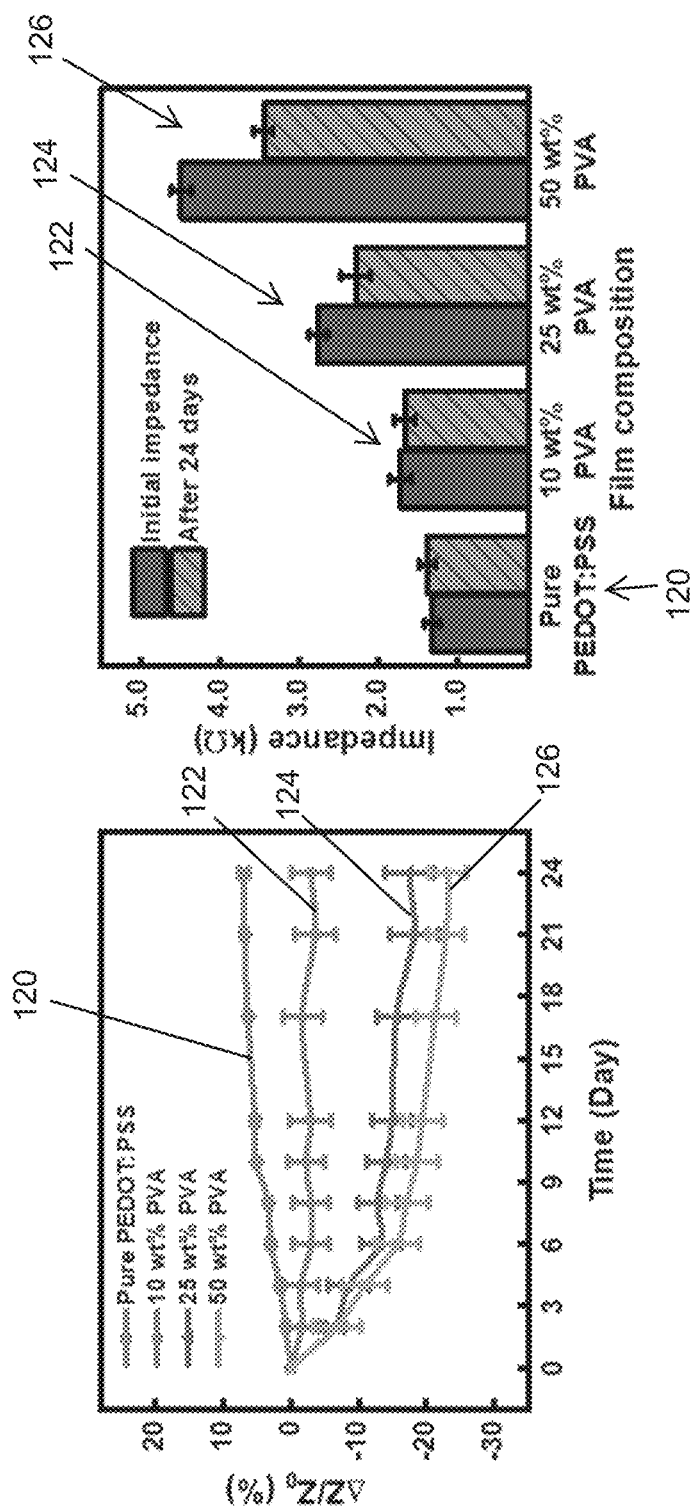
Figure 7A:
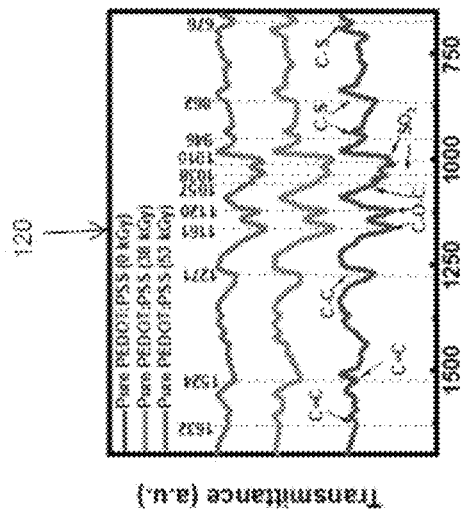
Figure 7B:
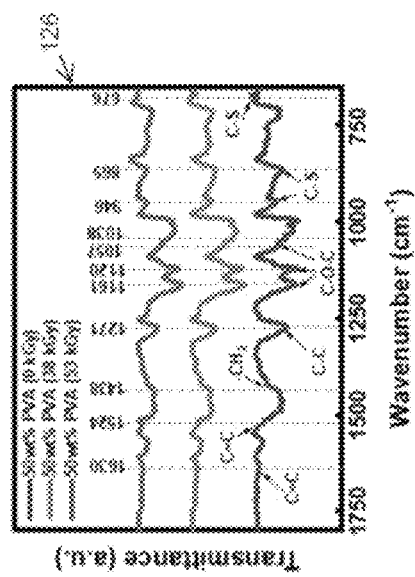
Figure 7C:
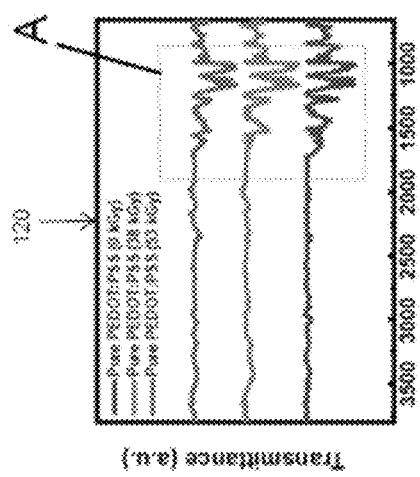
Figure 7D:
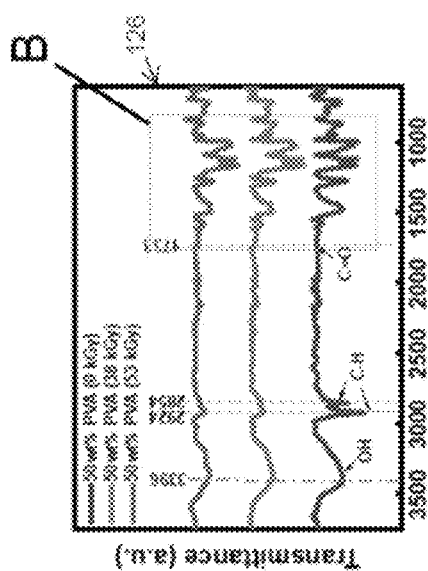
Figure 8:
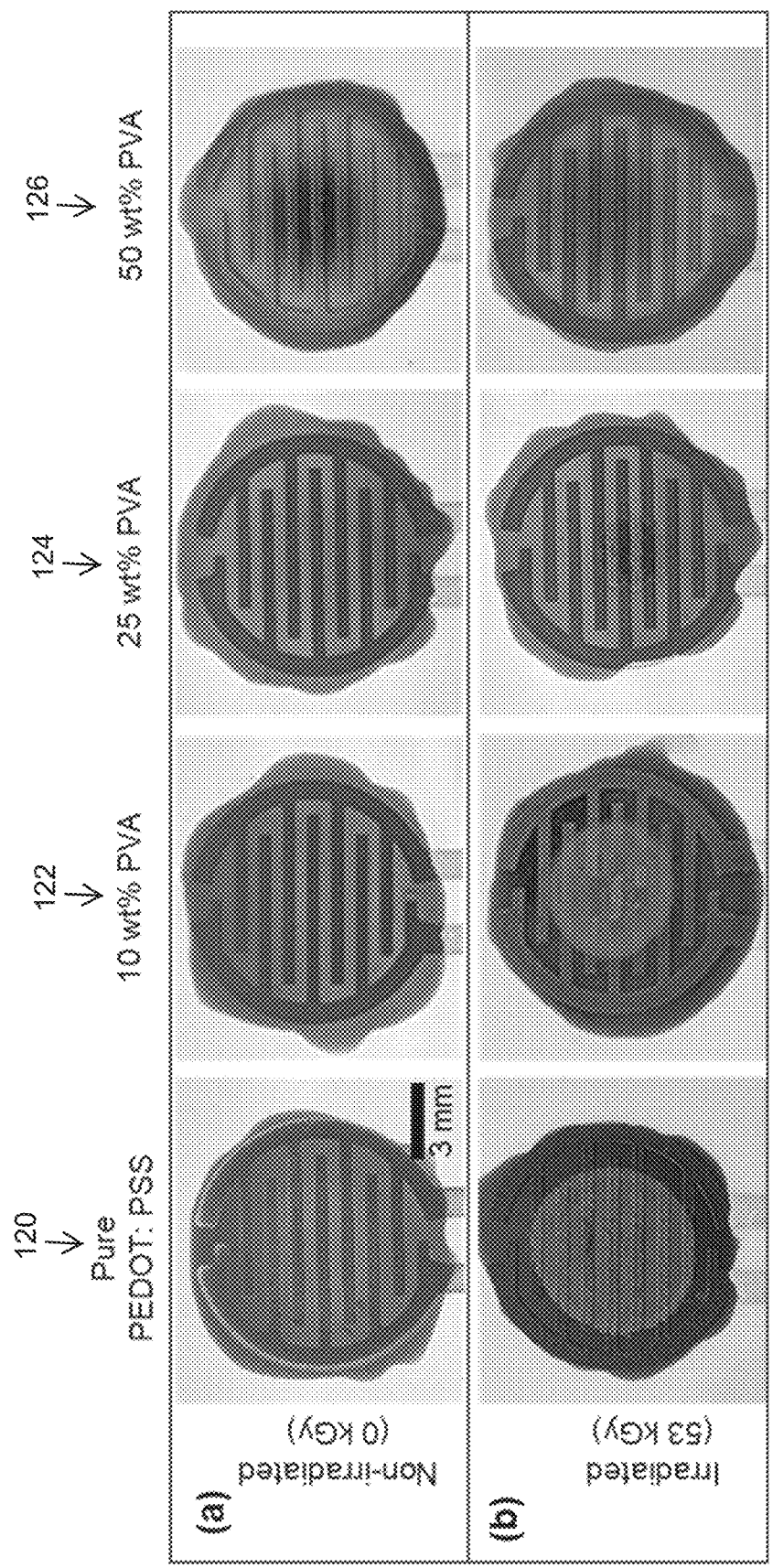
Figure 9A:
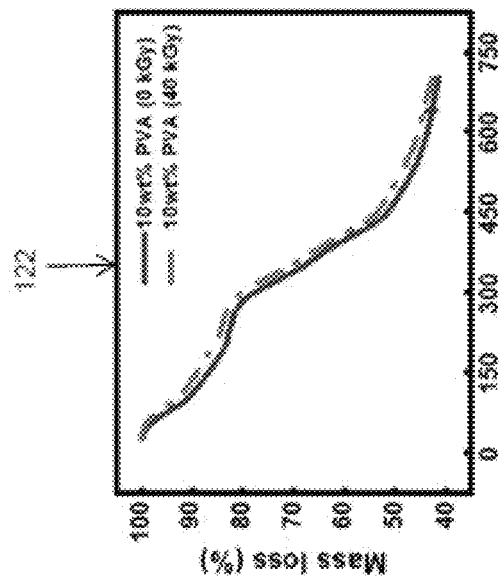
Figure 9B:
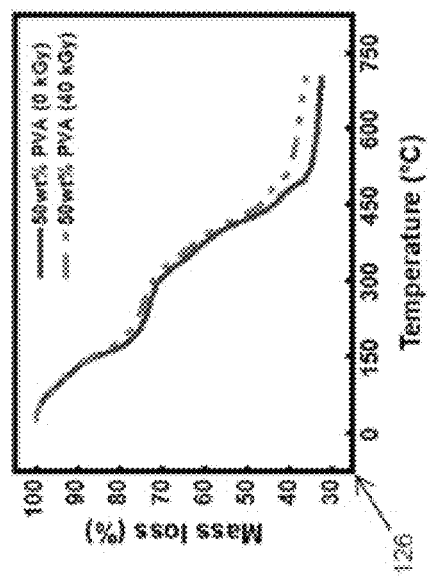
Figure 9C:
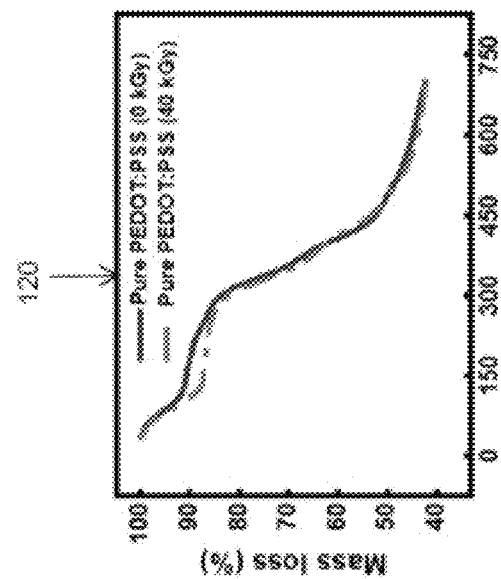
Figure 9D:
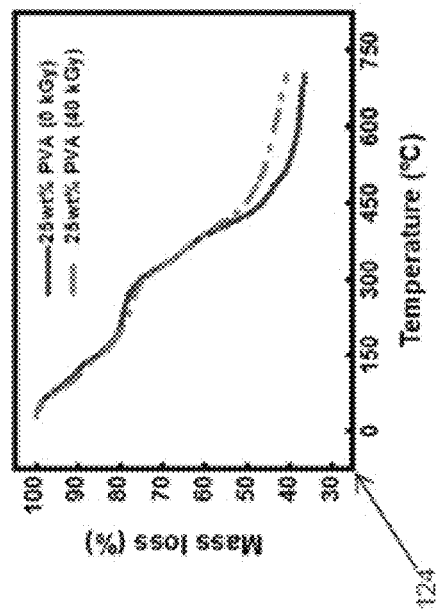
Figure 10:
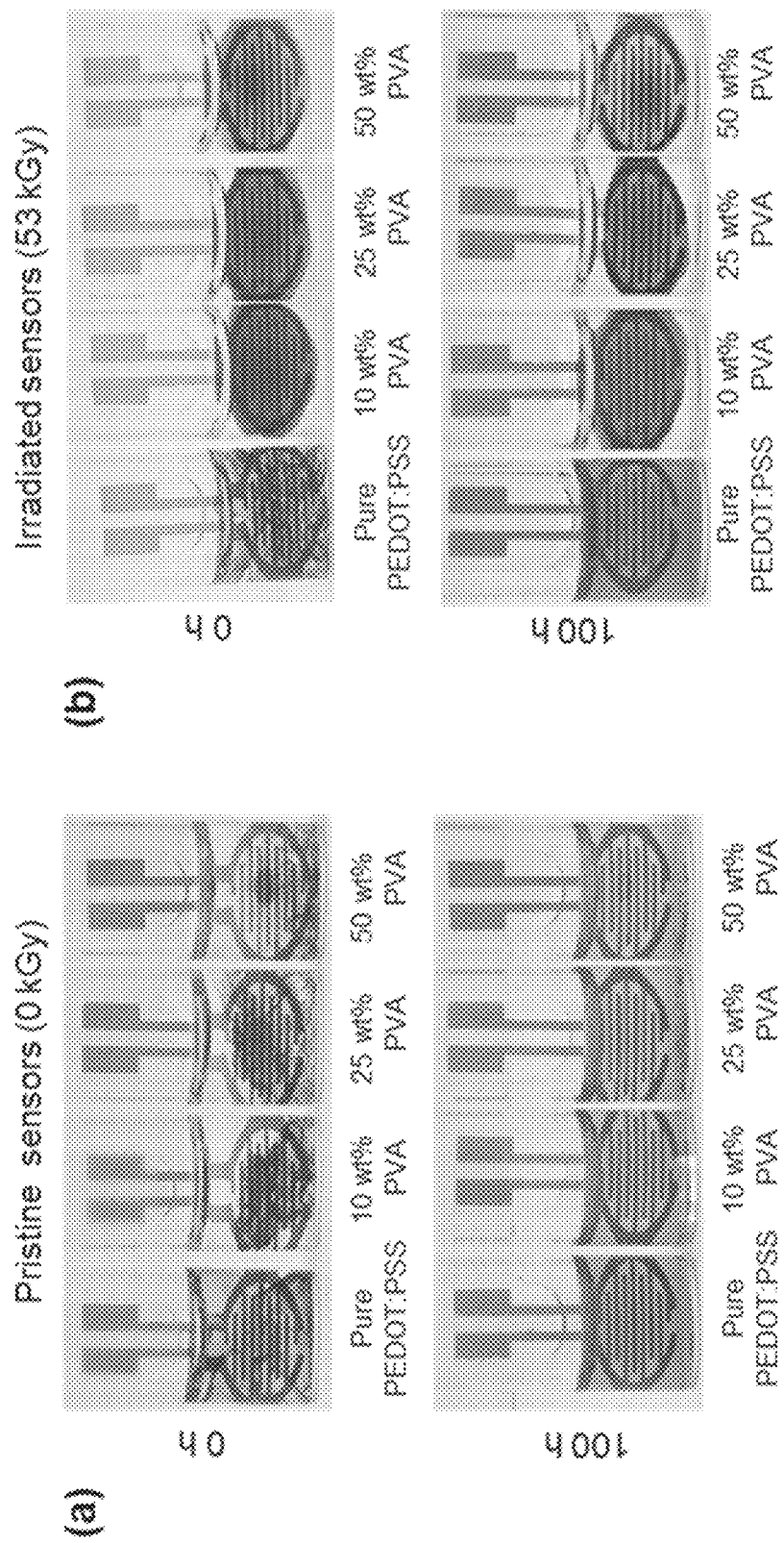
Figure 11B:
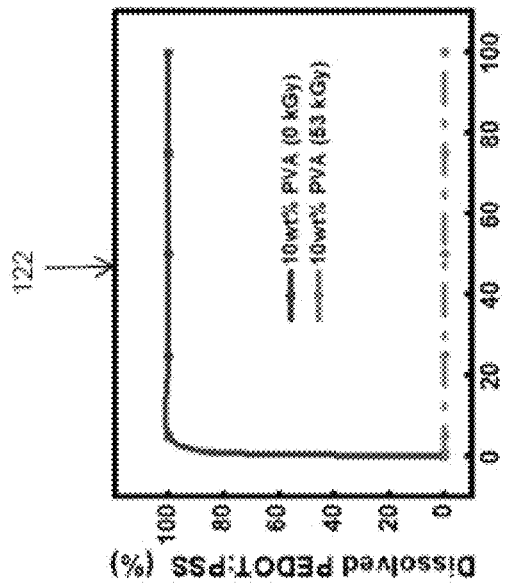
Figure 11D:
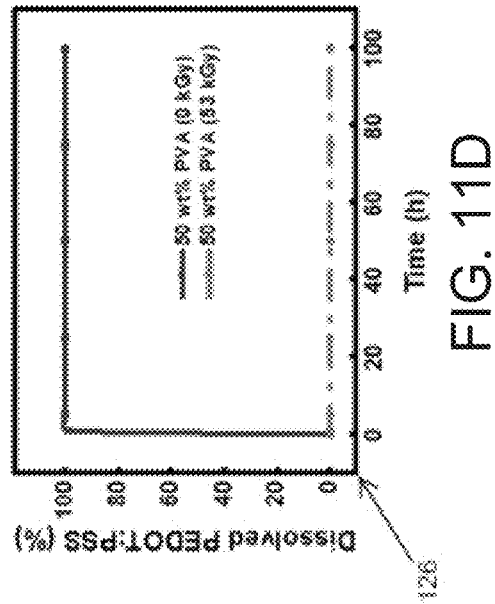
Figure 11A:
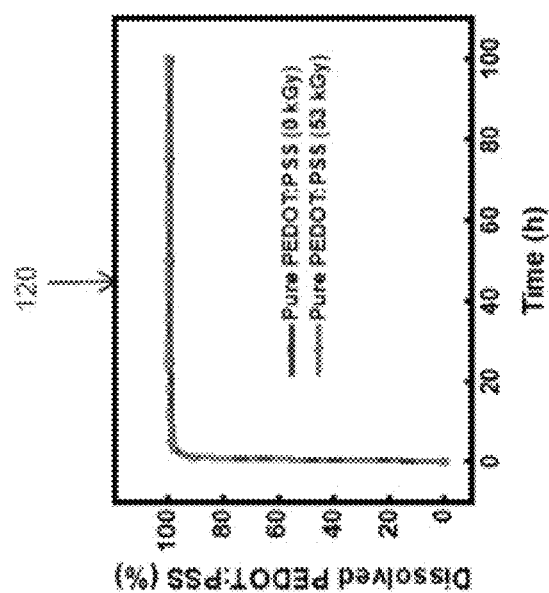
Figure 11C:
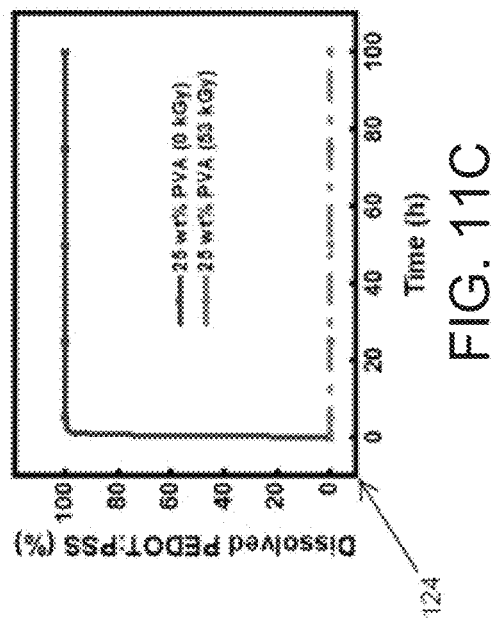
Figure 12:
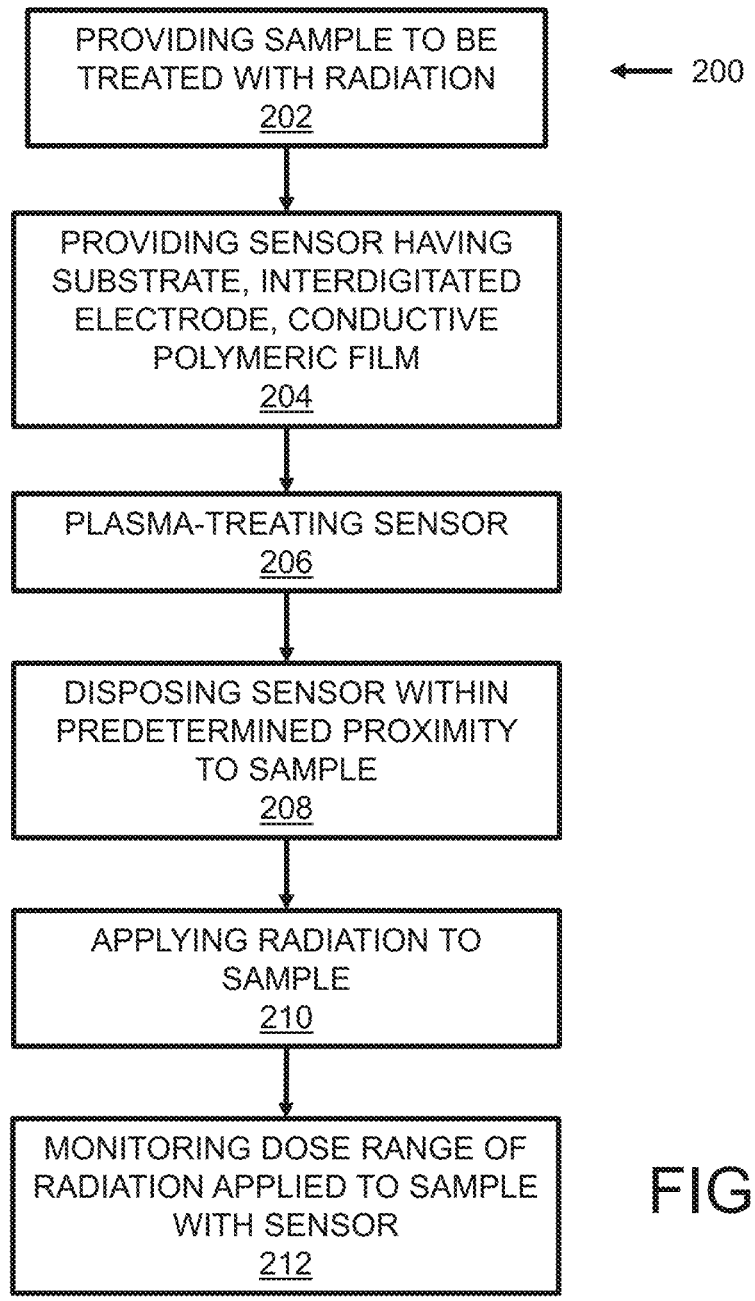

FIG. 3(a) is a schematic diagram illustrating a contact angle of the conductive polymeric film where the sensor is plasma-treated in comparison to where the sensor is non-plasma-treated, and furthering depicting the contact angle where the conductive polymeric film does not include PVA in comparison to where varying amounts of PVA are included, according to one embodiment of the present disclosure;

FIG. 3(b) is a bar graph illustrating the quantified average contact angles in the comparisons shown in FIG. 3(a), according to one embodiment of the present disclosure;

FIG. 4 is a schematic diagram, illustrating adhesion test results of the conductive polymeric film to the interdigitated electrode where the sensor was non-plasma-treated in comparison to where the sensor was plasma-treated;

FIG. 5(a) is a line graph depicting the relative impedance change over time until reaching stability of the sensor when no PVA is included in the conductive polymeric film in comparison to when varying amounts of PVA is included in the conductive polymeric film, according to one embodiment of the present disclosure;

FIG. 5(b) is a bar graph illustrating the relative impedance change of the sensor from the day of manufacturing compared to the relative impedance change of the sensor at twenty-four days after manufacturing, further depicting the difference in relative impedance change over time when no PVA is included in the conductive polymeric film in comparison to when varying amounts of PVA is included in the conductive polymeric film;

FIG. 6(a) is a line graph depicting the sensitivity of the sensor to varying doses of gamma radiation when no PVA is included in the conductive polymeric film in comparison to when varying amounts of PVA is included in the conductive polymeric film, according to one embodiment of the present disclosure;

FIG. 6(b) is a line graph depicting the sensitivity of the sensor over time when a 53 kGy dose of gamma radiation is applied to the sensor when no PVA is included in the conductive polymeric film in comparison to when varying amounts of PVA is included in the conductive polymeric film, according to one embodiment of the present disclosure;

FIG. 7(a) is a line graph illustrating the FTIR analysis of a non-irradiated sensor when no PVA is included in the conductive polymeric film in comparison to sensors irradiated with varying doses of radiation that also do not have PVA included in the conductive polymeric film, according to one embodiment of the present disclosure;

FIG. 7(b) is an enlarged view of call-out A, as shown in FIG. 7(a), illustrating the FTIR analysis of a non-irradiated sensor when no PVA is included in the conductive polymeric film in comparison to sensors irradiated with varying doses of radiation that also do not have PVA included in the conductive polymeric film, according to one embodiment of the present disclosure;

FIG. 7(c) is a line graph illustrating the FTIR analysis of a non-irradiated sensor where the conductive polymeric film includes fifty weight percent PVA in comparison to sensors irradiated with varying doses of radiation where the conductive polymeric film also includes fifty weight percent PVA, according to one embodiment of the present disclosure;

FIG. 7(d) is an enlarged view of call-out B, as shown in FIG. 7(c), illustrating the FTIR analysis of a non-irradiated sensor where the conductive polymeric film includes fifty weight percent PVA in comparison to sensors irradiated with varying doses of radiation where the conductive polymeric film also includes fifty weight percent PVA, according to one embodiment of the present disclosure;

FIG. 8 is a schematic diagram illustrating the solubility of the sensor in de-ionized water where non-irradiated sensors are compared to irradiated sensors and where varying amounts of PVA included in the conductive polymeric film is compared to where no PVA is included in the conductive polymeric film, according to one embodiment of the present disclosure;

FIG. 9(a) is a line graph illustrating a thermogravimetric analysis of the sensor, further depicting a mass loss of a non-irradiated sensor having no PVA in the conductive polymeric film compared to a mass loss of an irradiated sensor also having no PVA in the conductive polymeric film, according to one embodiment of the present disclosure;

FIG. 9(b) is a line graph illustrating a thermogravimetric analysis of the sensor, further depicting a mass loss of a non-irradiated sensor having ten weight percent PVA in the conductive polymeric film compared to a mass loss of an irradiated sensor also having ten weight percent PVA in the conductive polymeric film, according to one embodiment of the present disclosure;

FIG. 9(c) is a line graph illustrating a thermogravimetric analysis of the sensor, further depicting a mass loss of a non-irradiated sensor having twenty-five weight percent PVA in the conductive polymeric film compared to a mass loss of an irradiated sensor also having twenty-five weight percent PVA in the conductive polymeric film, according to one embodiment of the present disclosure;

FIG. 9(d) is a line graph illustrating a thermogravimetric analysis of the sensor, further depicting a mass loss of a non-irradiated sensor having fifty weight percent PVA in the conductive polymeric film compared to a mass loss of an irradiated sensor also having fifty weight percent PVA in the conductive polymeric film, according to one embodiment of the present disclosure;

FIG. 10 is a schematic diagram illustrating the solubility of the sensor in de-ionized water over time where non-irradiated sensors are compared to irradiated sensors and where varying amounts of PVA included in the conductive polymeric film is compared to where no PVA is included in the conductive polymeric film, according to one embodiment of the present disclosure;

FIG. 11(a) is a line graph illustrating the solubility over time of the conductive polymeric film in de-ionized water via ultraviolet-visible spectroscopy, further depicting the complete dissolution of the conductive polymeric film having no PVA in both non-irradiated and irradiated sensors, according to one embodiment of the present disclosure;

FIG. 11(b) is a line graph illustrating the solubility over time of the conductive polymeric film in de-ionized water via ultraviolet-visible spectroscopy, further depicting the complete dissolution of the conductive polymeric film having 10 weight percent PVA in non-irradiated sensors but no dissolution in irradiated sensors having 10 weight percent PVA in the conductive polymeric film, according to one embodiment of the present disclosure;

FIG. 11(c) is a line graph illustrating the solubility over time of the conductive polymeric film in de-ionized water via ultraviolet-visible spectroscopy, further depicting the complete dissolution of the conductive polymeric film having 25 weight percent PVA in non-irradiated sensors but no dissolution in irradiated sensors having 25 weight percent PVA in the conductive polymeric film, according to one embodiment of the present disclosure;

FIG. 11(d) is a line graph illustrating the solubility over time of the conductive polymeric film in de-ionized water via ultraviolet-visible spectroscopy, further depicting the complete dissolution of the conductive polymeric film having 50 weight percent PVA in non-irradiated sensors but no dissolution in irradiated sensors having 50 weight percent PVA in the conductive polymeric film, according to one embodiment of the present disclosure; and FIG. 12 is a flow chart illustrating a method of using the sensor, according to one embodiment of the present disclosure.

DETAILED DESCRIPTION

The following description of technology is merely exemplary in nature of the subject matter, manufacture and use of one or more inventions, and is not intended to limit the scope, application, or uses of any specific invention claimed in this application or in such other applications as may be filed claiming priority to this application, or patents issuing therefrom. Regarding methods disclosed, the order of the steps presented is exemplary in nature unless otherwise disclosed, and thus, the order of the steps can be different in various embodiments, including where certain steps can be simultaneously performed.

I. Definitions

Unless otherwise defined, all technical terms used herein have the same meaning as commonly understood by one of ordinary skill in the art to which the present disclosure pertains.

As used herein, the terms "a" and "an" indicate "at least one" of the item is present; a plurality of such items may be present, when possible. Except where otherwise expressly indicated, all numerical quantities in this description are to be understood as modified by the word "about" and all geometric and spatial descriptors are to be understood as modified by the word "substantially" in describing the broadest scope of the technology. "About" when applied to numerical values indicates that the calculation or the measurement allows some slight imprecision in the value (with some approach to exactness in the value; approximately or reasonably close to the value; nearly). If, for some reason, the imprecision provided by "about" and/or "substantially" is not otherwise understood in the art with this ordinary meaning, then "about" and/or "substantially" as used herein indicates at least variations that may arise from ordinary methods of measuring or using such parameters. In the present disclosure the terms "about" and "around" may allow for a degree of variability in a value or range, for example, within 10%, within 5%, or within 1% of a stated value or of a stated limit of a range. Likewise, in the present disclosure the term "substantially" can allow for a degree of variability in a value or range, for example, within 90%, within 95%, or within 99% of a stated value or of a stated limit of a range.

Although the open-ended term "comprising," as a synonym of non-restrictive terms such as including, containing, or having, is used herein to describe and claim embodiments of the present technology, embodiments may alternatively be described using more limiting terms such as "consisting of" or "consisting essentially of." Thus, for any given embodiment reciting materials, components, or process steps, the present technology also specifically includes embodiments consisting of, or consisting essentially of, such materials, components, or process steps excluding additional materials, components, or processes (for consisting of) and excluding additional materials, components or processes affecting the significant properties of the embodiment (for consisting essentially of), even though such additional materials, components or processes are not explicitly recited in this application. For example, recitation of a process reciting elements A, B and C specifically envisions embodiments consisting of, and consisting essentially of, A, B and C, excluding an element D that may be recited in the art, even though element D is not explicitly described as being excluded herein.

As referred to herein, disclosures of ranges are, unless specified otherwise, inclusive of endpoints and include all distinct values and further divided ranges within the entire range. Thus, for example, a range of "from A to B" or "from about A to about B" is inclusive of A and of B. Disclosure of values and ranges of values for specific parameters (such as amounts, weight percentages, etc.) are not exclusive of other values and ranges of values useful herein. It is envisioned that two or more specific exemplified values for a given parameter may define endpoints for a range of values that may be claimed for the parameter. For example, if Parameter X is exemplified herein to have value A and also exemplified to have value Z, it is envisioned that Parameter X may have a range of values from about A to about Z. Similarly, it is envisioned that disclosure of two or more ranges of values for a parameter (whether such ranges are nested, overlapping, or distinct) subsume all possible combination of ranges for the value that might be claimed using endpoints of the disclosed ranges. For example, if Parameter X is exemplified herein to have values in the range of 1-10, or 2-9, or 3-8, it is also envisioned that Parameter X may have other ranges of values including 1-9, 1-8, 1-3, 1-2, 2-10, 2-8, 2-3, 3-10, 3-9, and so on.

When an element or layer is referred to as being "on," "engaged to," "connected to," or "coupled to" another element or layer, it may be directly on, engaged, connected, or coupled to the other element or layer, or intervening elements or layers may be present. In contrast, when an element is referred to as being "directly on," "directly engaged to," "directly connected to" or "directly coupled to" another element or layer, there may be no intervening elements or layers present. Other words used to describe the relationship between elements should be interpreted in a like fashion (e.g., "between" versus "directly between," "adjacent" versus "directly adjacent," etc.). As used herein, the term "and/or" includes any and all combinations of one or more of the associated listed items.

Although the terms first, second, third, etc. may be used herein to describe various elements, components, regions, layers and/or sections, these elements, components, regions, layers and/or sections should not be limited by these terms. These terms may be only used to distinguish one element, component, region, layer or section from another region, layer, or section. Terms such as "first," "second," and other numerical terms when used herein do not imply a sequence or order unless clearly indicated by the context. Thus, a first element, component, region, layer, or section discussed below could be termed a second element, component, region, layer, or section without departing from the teachings of the example embodiments.

Spatially relative terms, such as "inner," "outer," "beneath," "below," "lower," "above," "upper," and the like, may be used herein for ease of description to describe one element or feature's relationship to another element(s) or feature(s) as illustrated in the figures. Spatially relative terms may be intended to encompass different orientations of the device in use or operation in addition to the orientation depicted in the figures. For example, if the device in the figures is turned over, elements described as "below", or "beneath" other elements or features would then be oriented "above" the other elements or features. Thus, the example term "below" can encompass both an orientation of above and below. The device may be otherwise oriented (rotated 90 degrees or at other orientations) and the spatially relative descriptors used herein interpreted accordingly.

As used herein, the term "DI Water" refers to De-Ionized Water which is water that has been treated to remove all ions.

As used herein, the term "wt %" refers to weight percent which is the mass fraction of a substance within a mixture.

As used herein, the term "dosimeter" refers to a device that measures dose uptake of external ionizing radiation.

II. Description

As shown in FIGS. 2(a)-2(d), a sensor 100 includes a substrate 102, an electrode 104, 106, and a conductive polymeric film 108. More particularly, the sensor 100 may be a gamma radiation sensor. The substrate 102 may be a flexible substrate. The electrode 104, 106 may be an interdigitated electrode. The interdigitated electrode 104, 106 may include a first electrode 104 and a second electrode 106. The first electrode 104 may include a plurality of first electrode digits 110. The second electrode 106 may include a plurality of second electrode digits 112. The interdigitated electrode 104, 106 may be disposed on the substrate 102. The conductive polymeric film 108 may include a blend 114, 116 of poly(3,4-ethylenedioxythiophene) polystyrene sulfonate (PEDOT:PSS) 114 and polyvinyl alcohol (PVA) 116. The blend 114, 116 of PEDOT:PSS 114 and PVA 116 may be collectively known as a composite polymer and/or a PEDOT:PSS/PVA composite. The conductive polymeric film 108 may be disposed on the interdigitated electrode 104, 106. In a specific example, the conductive polymeric film 108 may be disposed on and between the first electrode 104 and the second electrode 106. The sensor 100 may include an all-printed sensor that utilizes the blend 114, 116 of PVA 114 and PEDOT:PSS 116 as an active radiation sensing material. The PEDOT:PSS 114 may act as the electrically conductive medium, while the PVA 116 may advantageously provide ductility and stability of the printed sensor 100. Upon radiation exposure, the PVA 116 may crosslink within a material matrix of the printed radiation sensor 100 militating against the recombination of chain scission by forming a semi-interpenetrating polymer network (SIPN) 118 with PEDOT:PSS 114 which may result in a more stable impedance reading. Desirably, the radiation sensor 100 may utilize scalable printing technologies which may further permit low-cost manufacturing of the radiation sensor 100 at large scale.

Figure 1A:
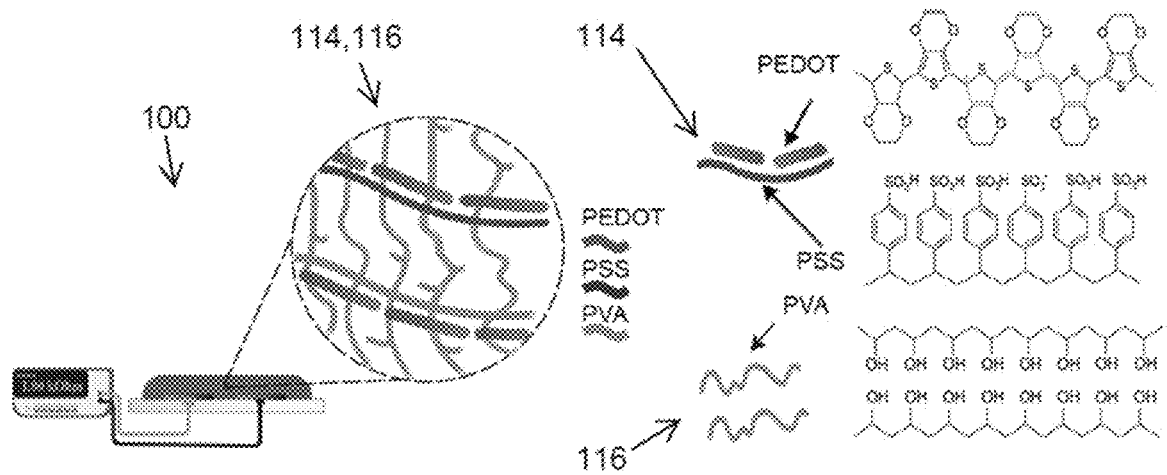
FIG. 1(a) is a schematic diagram of a sensor including a poly(3,4-ethylenedioxythiophene) polystyrene sulfonate (PEDOT:PSS) and polyvinyl alcohol (PVA) blend composite before irradiation, according to one embodiment of the present disclosure.
Figure 1B:
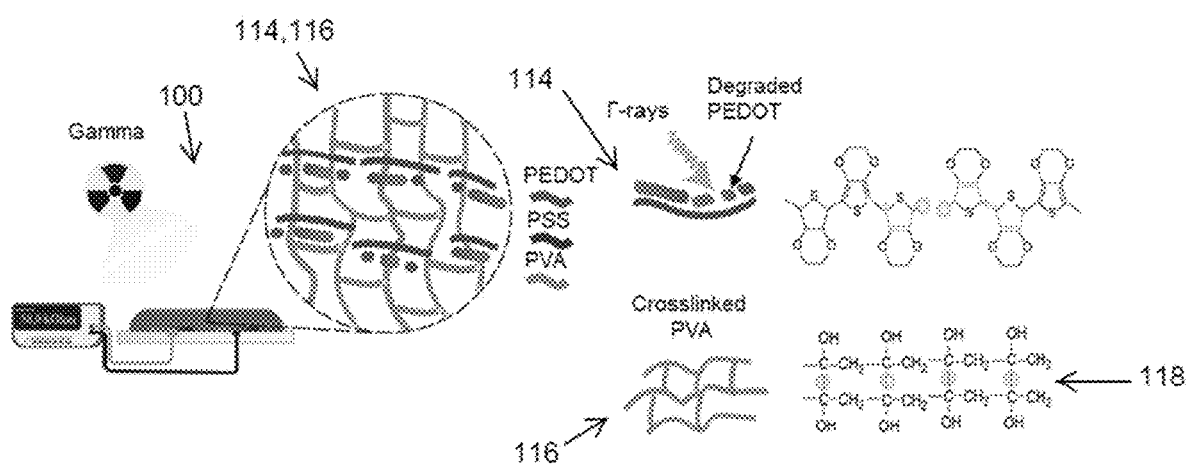
FIG. 1(b) is a schematic diagram of the sensor including a PEDOT:PSS/PVA composite, as shown in FIG. 1(a), after irradiation, further depicting the PVA crosslinked which may then hold the PEDOT:PSS chains in place after scission, according to one embodiment of the present disclosure.

The use of PVA 116 provides many advantages over other stabilizing agents in known radiation sensors. For instance, PVA 116 is water soluble and may provide desirable cross-linking properties. In a specific example, as shown in FIGS. 1(a-b), PVA 116 may crosslink when exposed to gamma radiation which may then be configured to hold PEDOT:PSS chains 114 in place after scission. Without being bound to any particular theory, it is believed that holding the PEDOT:PSS chains 114 in place may result in a linear change in resistance as opposed to an exponential increase. Desirably, the linear change in resistance enhances the stability of the impedance reading for sensing purposes. One skilled in the art may utilize other sensing materials to accommodate various ranges of radiation doses, within the scope of the present disclosure.

The use of PEDOT:PSS 114 provides many advantages over other electrically conductive mediums in known sensors. For instance, PEDOT:PSS 114 may be provided as a more efficient and cost-sensitive way to manufacture the radiation sensor 100 due to its current use as a printed material. Additive manufacturing and printing technologies involve building a part or product by gradually adding layers of material to create a final product. Advantageously, additive manufacturing may reduce the amount of material needed to produce products compared to traditional subtractive manufacturing in which parts are machined. Further, additive manufacturing allows for quick production of finely detailed parts. In certain circumstances, the radiation sensor 100 may be a printed and a disposable sensor developed through additive manufacturing and configured for single use applications. By developing the radiation sensor 100 as a printed dosimeter, the radiation sensor 100 may be manufactured more efficiently and provided less expensively when compared to known sensors. Desirably, the radiation sensor 100 provided as a printed material may also be more easily incorporated into packaging designs. In a specific example, the sensor 100 may be disposed on, within, and/or coupled to a packaged product. In a more specific example, the sensor 100 may be disposed on, within, and/or coupled to a packaged medical device.

The blend 114, 116 of the conductive polymeric film 108 may include various amounts of PEDOT:PSS 114 and PVA 116. In a specific example, the blend 114, 116 may include about 5-50 wt % of polyvinyl alcohol (PVA) 116, and about 50-95 wt % of poly(3,4-ethylenedioxythiophene) polystyrene sulfonate (PEDOT:PSS) 114. In a more specific example, the blend 114, 116 may include about 7.5-12.5% of polyvinyl alcohol (PVA) 116, and about 87.5-92.5 wt % of poly(3,4-ethylenedioxythiophene) polystyrene sulfonate (PEDOT:PSS) 114. In an even more specific example, the blend 114, 116 may include about 10 wt % of polyvinyl alcohol (PVA) 116, and about 90 wt % of poly(3,4-ethylenedioxythiophene) polystyrene sulfonate (PEDOT:PSS) 114.

In certain circumstances, the radiation sensor 100 may include ways of enhancing the adhesion and the spreading of the blend 114, 116 onto the interdigitated electrode 104, 106. For instance, the sensor 100 may be plasma treated to provide a desirably decreased contact angle CA. More specifically, the interdigitated electrode 104, 106 may be plasma treated. Advantageously, the decreased contact angle CA may increase the surface wettability of the composite polymer, thereby making it easier to consistently cover the complete electrode 104, 106 interdigitated area with the blend 114, 116. Further, the increased wettability of the plasma treated interdigitated electrode 104, 106 may also desirably enhance the adhesion of the blend 114, 116 to the surface of the interdigitated electrode 104, 106.

In another embodiment, the present technology includes methods of using the sensor 100. For instance, a method 200 of using the sensor 100 may include a step 202 providing a sample to be treated by radiation. In a specific example, the radiation may be gamma-radiation. The method 200 may also include a step 204 of providing a sensor 100 having a substrate 102, an electrode 104, 106, and a conductive polymeric film 108. The substrate 102 may be flexible. The electrode 104, 106 may be an interdigitated electrode including a first electrode 104 with a plurality of first electrode digits 110 and a second electrode 106 with a plurality of second electrode digits 112. The interdigitated electrode 104, 106 may be disposed on the substrate 102. The conductive polymeric film 108 may include a blend 114, 116 of poly(3,4-ethylenedioxythiophene) polystyrene sulfonate (PEDOT:PSS) 114 and polyvinyl alcohol (PVA) 116. The conductive polymeric film 108 may be disposed on the interdigitated electrode 104, 106. In a specific example, the conductive polymeric film 108 may be disposed on and between the first electrode 104 and the second electrode 106. In certain circumstances, the method 200 may also include a step 206 of plasma-treating the sensor 100. More particularly, the interdigitated electrode 104, 106 of the radiation sensor 100 may be plasma-treated. In a specific example, the step of plasma-treating the sensor 100 may be performed as the sensor 100 is manufactured and/or before the step 204 of providing the sensor 100. Next, the method 200 may include a step 208 of disposing the sensor 100 within a predetermined proximity to the sample. The predetermined proximity may include disposing the sensor 100 substantially adjacent to the sample, disposing the sensor 100 within the same packaging as the sample, and/or disposing the sensor 100 substantially adjacent to the packaging containing the sample. Afterwards, gamma radiation may be applied to the sample. The method 200 may further include monitoring a dose range of the gamma radiation applied to the sample with the sensor 100. In certain circumstances, the sensor 100 may be configured to provide a substantially linear relative change in resistance with a gamma radiation dose range of greater than zero kilogray to about fifty-three kilogray.

III. Example

Provided as a specific, non-limiting example, one embodiment of the radiation sensor 100 was produced by providing an aqueous dispersion of 1.3 wt. % PEDOT:PSS (0.5 wt. % PEDOT content and 0.8 wt. % PSS content,) as well as PVA powder (Mw 9,000-10,000, 80% hydrolyzed), which were obtained from SIGMA ALDRICH®. The PEDOT:PSS and PVA powder may be used without any further purification. For PEDOT:PSS/PVA composite preparation, a PVA stock solution was made by dissolving 10 wt. % PVA in de-ionized water and stirring at 90° C. for two hours followed by thirty minutes in an oven at 70° C. for thirty minutes. The PEDOT:PSS suspension was filtered with 12 μm pore-size filter paper. The filtered PEDOT:PSS suspension and the PVA solution were mixed to obtain PEDOT:PSS—PVA composites 114, 116 with 10 wt. %, 25 wt. % and 50 wt. % solid content of PVA 116. Each composite mixture 114, 116 was stirred for at least 24 hours before casting.

Figure 2A:
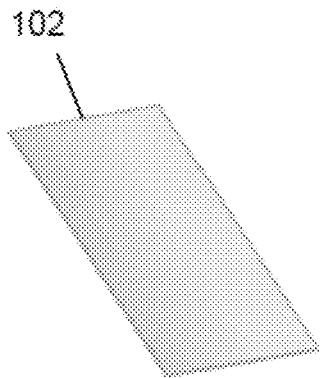
FIG. 2(a) is a schematic diagram of a substrate of the sensor, according to one embodiment of the present disclosure.
Figure 2B:
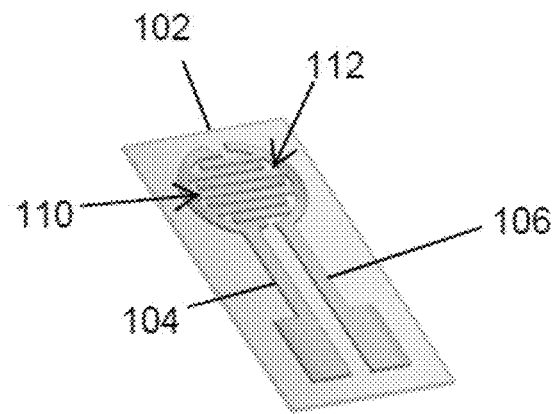
FIG. 2(b) is a schematic diagram of an interdigitated electrode disposed on the substrate, as shown in FIG. 2(a), according to one embodiment of the present disclosure.
Figure 2C:
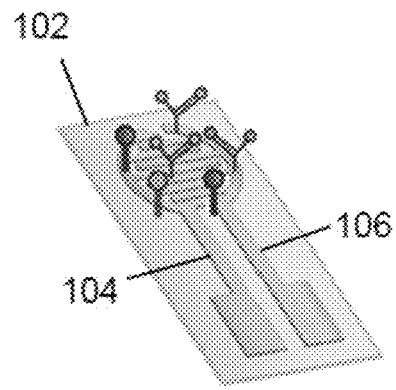
FIG. 2(c) is a schematic diagram of an interdigitated electrode being plasma-treated on the substrate, as shown in FIGS. 2(a)-2(b), according to one embodiment of the present disclosure.
Figure 2D:
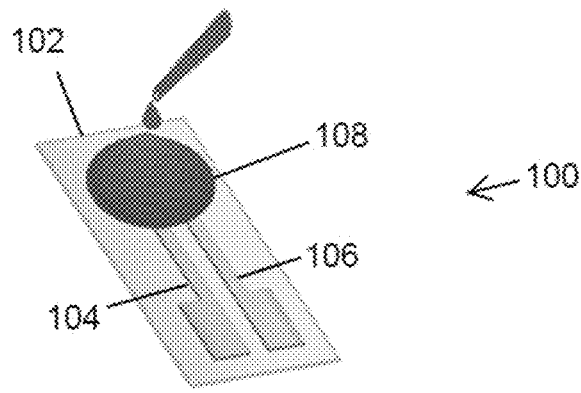
FIG. 2(d) is a schematic diagram of the PEDOT:PSS/PVA composite forming a conductive polymeric film on the interdigitated electrode and the substrate, as shown in FIGS. 2(a)-2(c), according to one embodiment of the present disclosure.

As shown in FIGS. 2(a)-2(d), provided as a non-limiting example and according to one embodiment of the present disclosure, the printed radiation sensor 100 was manufactured employing scalable technologies for printing electronics. More specifically, the interdigitated electrodes 104, 106 were printed with an MPS™ TF-100 screen printer and dried at one-hundred twenty degrees Celsius for five minutes, as shown in FIG. 2(b). Screen-printed electrodes 104, 106 were constructed from DUPONT® 5025 silver paste with a sheet resistivity of 12-15 mΩ/sq/mil onto polyethylene terephthalate (PET) sheets due to their enhanced bendability and thermal stability. To improve adhesion and spreading of the blend 114, 116, the screen-printed electrodes 104, 106 were plasma treated using a PE-25 plasma etching system for forty-five seconds operated at 50 KHz frequency and 200 W power, as shown in FIG. 2(c). Immediately after plasma treatment, around 50 µL of each blend 114, 116 was cast onto the interdigitated area of the electrodes 104, 106 and dried at lab conditions (293±2 K and 40% RH), as shown in FIG. 2(d). Sensor impedance was monitored after casting, and the sensors 100 were not used until they reached stability after several days after casting. As a result, a batch of fourteen printed sensors 100 per PET sheet were produced employing this efficient process. It should be appreciated that the printed radiation sensor 100 may be configured to be manufactured by roll-to-roll manufacturing systems.

The effect of plasma treatment on surface wettability was investigated by the sessile drop technique on a contact angle Ramé-Hart® Model 290 F1 Advanced Goniometer. Contact angle CA measurements were performed depositing drops of 10 µL volume of each solution on both plasma-treated and pristine PET substrates. The contact angles CA were measured from a left side and a right side of the drop, and average readings were recorded. Each contact angle CA measurement was repeated five times on new surfaces. All measurements were then averaged to give an averaged contact angle CA and their corresponding standard deviation.

The adhesion between PEDOT:PSS/PVA films 108 and the printed electrodes 104, 106 was evaluated in accordance with the American Society for Testing and Materials (ASTM D3330) by attaching a strip of pressure-sensitive tape fully covering the films 108 cast on top of the printed electrodes 104, 106. The attached tape strip was continuously and firmly peeled away at around a 90° angle to the films 108. The peeling test was conducted in triplicates for each composite cast in both pristine electrodes 104, 106 and plasma-treated electrodes 104, 106.

Three dosimeters per PEDOT:PSS/PVA composite 114, 116 were dried in lab conditions (293±2 K and 40% RH) for 24 days. Impedance measurements were carried out using an LCR meter (LCR-821, GW Instek) at 1 KHz frequency and 0.1 V amplitude voltage. The electrical impedance was reported as a percentage of relative impedance change using the following equation:

$$\frac{\Delta Z}{Z_0}(\%) = \left(\frac{Z - Z_0}{Z_0}\right) * 100\%$$

Where $\Delta Z/Z0$ is the relative impedance change expressed in a percentage, and $Z0$ is the initial impedance measurement after casting. The initial impedance of each PEDOT:PSS/PVA composite 114, 116 was calculated as the arithmetical average of all samples.

For each experiment, three printed dosimeters 100 per PEDOT:PSS/PVA composition 114, 116 were irradiated in the range of 0 kGy to 53 kGy using a gamma radiation source. More specifically, the gamma radiation source used was Gamma Cell 220 ® from Atomic Energy of Canada with a cobalt-60 source. The upper dose limit was set to around 50 kGy, given that this radiation dose has been previously used for the sterilization of human bone and tendon allograft. The absorbed dose of the printed sensors 100 was calculated based on the radiation exposure time and the decay corrected dose rate provided by the manufacturer set at 2.3 kGy/day. Impedance measurements were collected and reported in relative impedance change in the following intermediate absorbed doses: 0 kGy, 4.9 kGy, 9.5 kGy, 16 kGy, 21.2 kGy, 32.2 kGy, 39.03 kGy, 48.44 kGy and 53.39 kGy. After reaching a 53 kGy dose, dosimeter impedance was monitored for the subsequent eighteen days using the same LCR meter and reported in terms of relative impedance change every three days.

To study the effects of gamma radiation on the chemical structure of the composite polymeric films 108, non-irradiated and irradiated samples were examined by Attenuated Total Reflection Fourier Transform Infrared Spectroscopy (ATR-FTIR) using a PerkinElmer® Spectrum 100 FTIR Spectrometer over the range of 3800 cm-1 to 650 cm-1. Thermogravimetric analysis (TGA) was performed with a Netzsch® TG 203 F3 Tarsus, heating the non-irradiated and irradiated samples to 700° C. at a 20° C./min.

To verify the in-situ crosslinking of PVA 116 and the subsequent formation of a SIPN 118 after radiation exposure, changes in solubility were assessed by submerging the composites in glass containers with 3.5 mL of DI water for one-hundred hours under gentle agitation (400 rpm). The amount of PEDOT:PSS dissolved in the DI water was determined by ultraviolet-visible spectroscopy (UV-Vis spectroscopy). It should be appreciated that UV-Vis spectroscopy may be configured to analyze a sample at 1000 nm wavenumber. A linear calibration curve per each composite 114, 116 was created measuring the produced absorbance of the following dissolution percentages: 20%, 40%, 60%, 80% and 100%.

FIGS. 3(a)-(b) show the contact angle CA measurements performed on pristine and plasma-treated PET substrates 102. As shown in FIG. 3(a), there was a substantial decrease in contact angle CA on all plasma-treated substrates 102 compared to non-plasma-treated PET substrates 102. This significant difference in contact angle CA is observable in all measurements irrespective of the PEDOT:PSS/PVA composite 114, 116 deposited. In a specific example, the conductive polymeric film 108 of the plasma treated samples may have a contact angle CA that is less than sixty degrees. With reference to FIG. 3(b), the average contact of all pristine PET substrate 102 is around 75° and the plasma treated samples exhibited a contact angle CA less than 42°. Similar results were observed previously between water drops deposited pristine and plasma treated PET substrate 102. This increase in surface wettability of plasma treated samples is attributed to the introduction of chemical functional groups that interacts with the PEDOT:PSS/PVA composites 114, 116. Moreover, with continued reference to FIG. 3(b), the addition of PVA 116 also resulted in a decrease of contact angle CA measurements. Without being bound to any particular theory, it is believed this occurred due to the interaction of alcohol groups on the PVA chains 116 with polar groups on the PET surface. Advantageously, as a result of the increased surface wettability, it may be easier to consistently cover the complete electrode 104, 106 interdigitated area with the composite materials 114, 116. In contrast, as shown in FIG. 4, spreading of the composites 114, 116 onto the electrode 104, 106 interdigitated area of the not plasma-treated sensors 100 was difficult and, in some cases, left uncovered regions between digits. With continued reference to FIG. 4, the increased wettability of plasma treated surfaces desirably also led to better adhesion of the composite materials to the surface of the electrodes 104, 106.

To investigate the impedance stability of printed sensors 100 after casting, periodic readings every three days were carried out for the subsequent twenty-four days of air exposure at room temperature. As shown in FIG. 5(b), after casting, the initial impedance values for pure PEDOT:PSS 120 and PEDOT:PSS/PVA composites with 10 wt % PVA 122, 25 wt % PVA 124, and 50 wt % PVA 126 content were 1.28 k$\Omega$, 1.73 k$\Omega$, 2.75 k$\Omega$ and 4.48 k$\Omega$, respectively. The sensor impedance consistently increased with PVA 116 weight percent since the PEDOT:PSS (conductive material within the composite) content 114 was decreased. As shown in FIG. 5(a), the evolution of sensor impedance is measured as a function of time (air exposure). While pure PEDOT:PSS sensors experienced a slight impedance increase, the PEDOT:PSS-PVA composites 122, 124, 126 exhibited a significant impedance decrease proportional to the PVA 116 content, especially during the first week after casting. Without being bound to any particular theory, it is believed the noticeable decrease in impedance is due to the slow desorption of free water from the PEDOT:PSS/PVA composites 122, 124, 126 over time. After twenty-four days, the relative impedance changes of pure PEDOT:PSS 120 and PEDOT: PSS/PVA 122, 124, 126 composites were 7%, −3%, −17% and −23%, respectively.

As shown in FIG. 6(a), the conductivity dependence on the radiation dose of PEDOT:PSS/PVA composites 114, 116. In terms of sensitivity to radiation, pristine PEDOT:PSS was the most sensitive tested material reaching relative average impedance changes in the order of 3,000% at 53 kGy. However, the dispersion of sensor readings also increased with radiation dose, showing undesirably large variations after passing 40 kGy (not plotted). For instance, at 53 kGy dose, pure PEDOT:PSS sensors exhibited impedance changes between 1970% and 6900%. On the other hand, PVA 116 reduced the sensor sensitivity but at the same time, the dispersion of readings was reduced. This is the case of composites with 10 wt % PVA 122 whose impedance gradually increased until reaching 49% change at 40 kGy with a standard deviation of ±6.9%. Similarly, composites with 25 wt % PVA 124 increased their impedance by about 25%±5.0%. This increment on impedance is associated to the disruption of electrical pathways in PEDOT polymer chains due to chain scission upon radiation. FIG. 6(b) shows the long-term stability of the printed sensors 100 after receiving 53 kGy of radiation exposure. Pure PEDOT:PSS manifested the largest variations in impedance over the eighteen-day time frame, which may be attributed to the recombination effect of free radicals present in the film 108. At day seven after radiation, pure PEDOT:PSS experienced an average impedance change of twenty-three percent while in day eighteen presented negative twenty-three percent of impedance change. Unlike the pure PEDOT:PSS sensors, those with even 10 wt % PVA 122 remained relatively stable in the same timeframe. For instance, the sensor 100 with the blend 114, 116 including PEDOT:PSS 114 and PVA 116 may have an average impedance change within fifteen percent over an eighteen-day period after radiation exposure. This improvement in stability may be ascribed to the formation of the in situ semi-interpenetrating polymer network 118 between PEDOT:PSS 114 and PVA 116 polymer chains reducing polymer chain recombination. One skilled in the art may use other methods to form the semi-interpenetrating polymer network 118 of the sensor 100, within the scope of the present disclosure.

FIGS. 7(a-d) display the FTIR spectra of the printed sensors 100 at different radiation exposures. FIG. 7(a) shows the full range FTIR spectra for pure PEDOT:PSS samples 120. FIG. 7(b) shows an enlarged spectra of the fingerprint region appearing within the wavenumber range of 1700 cm-1 to 650 cm-1. The peaks at 1524 cm-1 and 1271 cm-1 are assigned to C=C and C—C stretching vibrations of the thiophene ring in PEDOT polymer chains respectively. The observed peaks at 946 cm-1, 862 cm-1, and 676 cm-1 correspond to stretching of C—S bond in the thiophene ring of PEDOT chains. Additionally, peaks at 1181 cm-1, 1120 cm-1, and 1057 cm-1 can be assigned to the C—O—C bond stretching which originates in the ethylenedioxy group of PEDOT chains. PSS functional groups are confirmed by the peaks at 1038 cm-1 and 1010 cm-1 which correspond to the stretching of a sulfonic acid group (SO3-) and the observed peak at 1632 cm-1 related to the stretching of less strained C=C bonds originating in the benzene rings found in PSS polymer chains. FIG. 7(b) represents a noticeable decrease in the intensity of several peaks by increasing the radiation exposure. Specifically, the peaks at 1524 cm-1, 1271 cm-1, and 862 cm-1 that are assigned to the C=C, C—C, C—S, respectively in PEDOT chains exhibited a significant decrease in intensity. Similarly, the observed peak at 1632 cm-1, 1038 cm-1, and 1010 cm-1 which corresponded to the C=C and the stretching of sulfonic acid group in PSS chains decreased by radiation exposure time. The observed reduction in peak intensities represents that the polymer degradation of PEDOT:PSS originated from the exposure to the high levels of radiation.

FIG. 7(c) and FIG. 7(d) display the FTIR spectra of PEDOT:PSS/PVA composites with 50 wt % PVA 126. As shown in FIG. 7(c), a broad absorption band at around 3396 cm-1, associated to the symmetrical stretching vibration of the —OH groups, was observed. Further, the peaks appearing at 2924 cm-1 and 2854 cm-1 can be attributed to the C—H stretching vibration of PVA and PSS chains. Similar to the FTIR of irradiated pure PEDOT:PSS samples, a decrease in all peak intensities associated with PEDOT and PSS was observed, as shown in FIG. 7(c). However, the decrease of —OH functional groups in the PVA trials can be attributed to the crosslinking among PVA chains 116, giving rise to the formation of a SIPN 118 with gamma radiation.

FIG. 9(a-d) illustrates the thermogravimetric analysis of composites (TGA) curves of the irradiated and the non-irradiated dosimeters. As shown in FIG. 9(a), the pure PEDOT:PSS samples 120 are shown to have three mass loss regions. The first mass loss region observed from sixty degrees Celsius to one-hundred fifty degrees Celsius may be attributed to the evaporation of water. The second mass loss, from one-hundred fifty degrees Celsius to three-hundred degrees Celsius, can be attributed to the PSS decomposition through a rupture of the sulfonate group from styrene. Finally, the third mass loss region from three-hundred degrees Celsius to six-hundred degrees Celsius can be ascribed to the rupture of the PEDOT/PSS polymer backbone. TGA curves of pure PEDOT:PSS 120 revealed that the irradiated samples degraded at a slightly faster rate and retained about forty percent weight at six-hundred degrees Celsius which is 1.5% less than non-irradiated samples. This subtle difference in degradation rate and mass loss can be attributed to the polymer degradation observed in the FTIR spectra of irradiated pure PEDOT:PSS samples 120. In contrast, as shown in FIGS. 9(b-d) irradiated PEDOT:PSS/PVA composites 122, 124, 126 retained more mass compared to non-irradiated composites with the same PVA content 122, 124, 126. Thus, composites with 10 wt % 122, 25 wt % 124, and 50 wt % 126 PVA content retained 1.82%, 5.46%, and 4.53% more weight, respectively. Advantageously, this enhancement in thermal stability can be attributed to the crosslinked PVA structure formed upon radiation, which is in accordance with the FTIR results.

To confirm crosslinking of PVA 116 and the formation of a SIPN 118 after radiation exposure, the water solubility of both irradiated and non-irradiated films 108 was examined. It is well known that both PEDOT:PSS 114 and PVA 116 are water-soluble polymers. Even though PEDOT is not water-soluble by itself, the small PEDOT polymer chains are tightly bonded to the long PSS polymer chains 114, which in turn, are water-soluble making the whole material water-soluble. However, the crosslinked forms of PSS 114 and PVA 116 are not water soluble and can be produced by ionizing radiation exposure under certain processing conditions. FIG. 8 illustrates the non-irradiated and the irradiated samples soaked in DI water at room temperature subjected to gentle agitation at four-hundred revolutions per minute (RPM). All non-irradiated films, irrespectively of their composition, started to dissolve as soon as they were soaked in the de-ionized water, changing the aqueous media color to a characteristic light blue color of PEDOT:PSS. As shown in FIG. 8, this visual outcome, alongside the FITR results, confirms that non-irradiated films have no crosslinked structures and are water soluble. A similar behavior was shown in irradiated pure PEDOT:PSS films 120, which are fully soluble in DI water. Since irradiated PEDOT:PSS films did not exhibit any change in solubility, the crosslinking degree of PSS polymer chains was null or very small after irradiation. In contrast, irradiated films 108 containing 10 wt % PVA 122, 25 wt % PVA 124, and 50 wt % PVA 126 became insoluble after radiation exposure indicating crosslinking of PVA polymer chains 116. Further, the appearance of a lighter circular area for the irradiated samples, as shown in FIG. 8, represents that the polymer degradation was indeed responsible for the observed conductivity. Advantageously, as shown in FIG. 10, even after one-hundred hours of submersion in DI water, the irradiated films 108 containing 10 wt % PVA 122, 25 wt % PVA 124, and 50 wt % PVA 126 remained attached to the substrate 102 exhibiting outstanding film integrity without apparent PEDOT:PSS 114 leaching supported by the lack of color change in the aqueous media.

As shown in FIGS. 11(a)-(d), the amount of PEDOT:PSS 114 dissolved in DI water was quantitatively analyzed by UV-Vis Spectroscopy. As shown in FIGS. 11(a-d), all non-irradiated films showed one-hundred percent dissolution in the first ten minutes of the dissolution test. However, no trials of PEDOT:PSS 114 leaching was detected in any of the irradiated films 108 containing PVA 116 in their composition. Accordingly, even the addition of 10 wt % of PVA 116 was enough to form a SIPN 118 upon irradiation, thus reducing the polymer recombination and enhancing stability of readings after radiation exposure.

Advantageously, the sensor 100 enhances the certainty of adequate sterility and may be manufactured more efficiently over known radiation sensors. The sensor 100 also enhances the adhesion and the spreading of the composite polymer 114, 116 onto the interdigitated electrode 104, 106 by plasma-treating the sensor 100.

Example embodiments are provided so that this disclosure will be thorough and will fully convey the scope to those who are skilled in the art. Numerous specific details are set forth such as examples of specific components, devices, and methods, to provide a thorough understanding of embodiments of the present disclosure. It will be apparent to those skilled in the art that specific details need not be employed, that example embodiments may be embodied in many different forms, and that neither should be construed to limit the scope of the disclosure. In some example embodiments, well-known processes, well-known device structures, and well-known technologies are not described in detail. Equivalent changes, modifications and variations of some embodiments, materials, compositions, and methods can be made within the scope of the present technology, with substantially similar results.

What is claimed is:

1. A sensor, wherein the sensor comprises:
   a substrate;
   an electrode disposed on the substrate; and
   a conductive polymeric film disposed on the electrode, wherein the conductive polymeric film includes a blend of poly(3,4-ethylenedioxythiophene) polystyrene sulfonate (PEDOT:PSS) and polyvinyl alcohol (PVA), wherein the sensor is a gamma radiation sensor.

2. The sensor of claim 1, wherein the electrode is an interdigitated electrode.

3. The sensor of claim 1, wherein the substrate is a flexible substrate.

4. The sensor of claim 2, wherein the interdigitated electrode includes first electrode with a plurality of first electrode digits and a second electrode with a plurality of second electrode digits.

5. The sensor of claim 1, wherein the blend includes about 5-50 wt % of polyvinyl alcohol (PVA), and about 50-95 wt % of poly(3,4-ethylenedioxythiophene) polystyrene sulfonate (PEDOT:PSS).

6. The sensor of claim 1, wherein the blend includes about 7.5-12.5 wt % of polyvinyl alcohol (PVA), and about 87.5-92.5 wt % of poly(3,4-ethylenedioxythiophene) polystyrene sulfonate (PEDOT:PSS).

7. The sensor of claim 1, wherein the blend includes about 10 wt % of polyvinyl alcohol (PVA), and about 90 wt % of poly(3,4-ethylenedioxythiophene) polystyrene sulfonate (PEDOT:PSS).

8. The sensor of claim 1, wherein the sensor is plasma treated.

9. The sensor of claim 1, wherein the conductive polymeric film has a contact angle that is less than sixty degrees.

10. The sensor of claim 1, wherein the sensor is substantially insoluble after radiation exposure.

11. The sensor of claim 4, wherein the conductive polymeric film is disposed on and between the plurality of digits of the first electrode and the plurality of digits of the second electrode.

12. The sensor of claim 1, wherein the sensor is configured to form a semi-interpenetrating polymer network.

13. The sensor of claim 1, wherein the sensor has an average impedance change within fifteen percent over an eighteen-day period after radiation exposure.

14. A method of measuring gamma radiation dose comprising:
   providing a sample to be treated with radiation;
   providing a sensor including:
      a substrate;
      an electrode disposed on the substrate; and
      a conductive polymeric film disposed on the electrode, wherein the conductive polymeric film includes a blend of poly(3,4-ethylenedioxythiophene) polystyrene sulfonate (PEDOT:PSS) and polyvinyl alcohol (PVA);
   disposing the sensor within a predetermined proximity to the sample;
   applying radiation to the sample; and
   monitoring a dose range of the radiation applied to the sample with the sensor, wherein the radiation is gamma radiation.

15. The method of claim 14, wherein the sensor is configured to provide a substantially linear relative change in resistance with a gamma radiation dose range of greater than zero kilogray to about fifty-three kilogray.

16. The method of claim 14, further comprising a step of plasma-treating the sensor.

* * * * *